United States Patent
Chen (10) Patent No.: US 12,113,528 B2
(45) Date of Patent: Oct. 8, 2024

(54) OUTPUT DRIVER USING FEEDBACK NETWORK FOR SLEW RATE REDUCTION AND ASSOCIATED OUTPUT DRIVING METHOD

(71) Applicant: Airoha Technology Corp., Hsinchu (TW)

(72) Inventor: Huan-Sheng Chen, Hsinchu County (TW)

(73) Assignee: Airoha Technology Corp., Hsinchu (TW)

( * ) Notice: Subject to any disclaimer, the term of this patent is extended or adjusted under 35 U.S.C. 154(b) by 170 days.

(21) Appl. No.: 17/868,739

(22) Filed: Jul. 19, 2022

(65) Prior Publication Data

US 2023/0238960 A1    Jul. 27, 2023

Related U.S. Application Data

(60) Provisional application No. 63/303,036, filed on Jan. 26, 2022.

(51) Int. Cl.
*H03K 19/003* (2006.01)
*H03K 19/00* (2006.01)
*H03K 19/0948* (2006.01)

(52) U.S. Cl.
CPC ... *H03K 19/00346* (2013.01); *H03K 19/0005* (2013.01); *H03K 19/0948* (2013.01)

(58) Field of Classification Search
None
See application file for complete search history.

(56) References Cited

U.S. PATENT DOCUMENTS

| | | | | |
|---|---|---|---|---|
| 4,754,165 A | * | 6/1988 | Cornish | H03K 3/35606 327/212 |
| 5,173,870 A | * | 12/1992 | Sukashita | G06F 7/503 708/625 |
| 6,583,656 B1 | | 6/2003 | Liu | |
| 7,196,550 B1 | * | 3/2007 | Reinschmidt | H03K 19/00323 327/55 |
| 7,764,086 B2 | | 7/2010 | Lu | |
| 8,519,743 B2 | * | 8/2013 | Teh | H03K 19/096 327/202 |
| 8,638,131 B2 | | 1/2014 | Chen | |
| 2002/0024360 A1 | | 2/2002 | Porter | |

(Continued)

*Primary Examiner* — Jany Richardson
(74) *Attorney, Agent, or Firm* — Winston Hsu (57) ABSTRACT

An output driver includes a first pre-driver circuit, a first driver circuit, a second pre-driver circuit, a second driver circuit, and a feedback network. The first pre-driver circuit pre-drives a first data input signal to generate a first pre-driving output signal. The first driver circuit drives the first pre-driving output signal to generate a first data output signal. The second pre-driver circuit pre-drives a second data input signal to generate a second pre-driving output signal, wherein the first data input signal and the second data input signal are a differential input of the output driver. The second driver circuit drives the second pre-driving output signal to generate a second data output signal. The feedback network performs a latching operation upon the first pre-driving output signal and the second pre-driving output signal according to the first data output signal and the second data output signal.

14 Claims, 10 Drawing Sheets

(56) References Cited

U.S. PATENT DOCUMENTS

2002/0135396 A1   9/2002  Kiehl
2008/0136467 A1   6/2008  Tambouris
2011/0018853 A1   1/2011  Kawagoshi

* cited by examiner

OUTPUT DRIVER USING FEEDBACK NETWORK FOR SLEW RATE REDUCTION AND ASSOCIATED OUTPUT DRIVING METHOD

CROSS REFERENCE TO RELATED APPLICATIONS

This application claims the benefit of U.S. Provisional Application No. 63/303,036, filed on Jan. 26, 2022. The content of the application is incorporated herein by reference.

BACKGROUND OF THE INVENTION

1. Field of the Invention

The present invention relates to an output driver design, and more particularly, to an output driver that uses a feedback network for slew rate reduction and an associated output driving method.

2. Description of the Prior Art

An output driver for use in a semiconductor device is a driving circuit for driving an external element according to data from an internal element. The slew rate of the output driver is an index for representing how fast the voltage level of the output signal changes, which may be defined as a slope depicting voltage level change per unit time. Thus, the larger slew rate shows the more abrupt slope of the output signal, which means the voltage level changes in shorter time. Slew rate reduction is generally required to alleviate the electromagnetic interference (EMI) problem. However, the conventional slew rate reduction design is not cost effective and suffers from ineffective performance. There is a need for an innovative slew rate reduction design.

SUMMARY OF THE INVENTION

One of the objectives of the claimed invention is to provide an output driver that uses a feedback network for slew rate reduction and an associated output driving method.

According to a first aspect of the present invention, an exemplary output driver is disclosed. The exemplary output driver includes a first pre-driver circuit, a first driver circuit, a second pre-driver circuit, a second driver circuit, and a feedback network. The first pre-driver circuit is arranged to receive a first data input signal to generate a first pre-driving output signal. The first driver circuit is arranged to receive the first pre-driving output signal to generate a first data output signal. The second pre-driver circuit is arranged to receive a second data input signal to generate a second pre-driving output signal, wherein the first data input signal and the second data input signal are a differential input of the output driver. The second driver circuit is arranged to receive the second pre-driving output signal to generate a second data output signal. The feedback network is arranged to perform a latching operation upon the first pre-driving output signal and the second pre-driving output signal according to the first data output signal and the second data output signal.

According to a second aspect of the present invention, an exemplary output driving method is disclosed. The exemplary output driving method includes: receiving a first data input signal to generate a first pre-driving output signal; receiving the first pre-driving output signal to generate a first data output signal; receiving a second data input signal to generate a second pre-driving output signal, wherein the first data input signal and the second data input signal are a differential input; receiving the second pre-driving output signal to generate a second data output signal; and performing a latching operation upon the first pre-driving output signal and the second pre-driving output signal according to the first data output signal and the second data output signal.

According to a third aspect of the present invention, another exemplary output driver is disclosed. The exemplary output driver includes a first driver circuit, a first pre-driver circuit, and a feedback network. The first pre-driver circuit is arranged to drive the first driver circuit by inputting a first pre-driving output signal to an input of the first driver circuit. The feedback network is arranged to during a voltage level transition at the input of the first driver circuit provide the first driver circuit with a second signal, the second signal having the same voltage level transition as the first pre-driving output signal, but delayed from the first pre-driving output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The conventional slew rate reduction design generally occupies a large die area due to the use of a capacitor array or shows insignificant tuning effect due to the use of resistor-capacitor (RC) control in a preceding stage. Thus, there is a need for an innovative slew rate reduction design which can effectively reduce the slew rate of the output driver, without occupying a large chip area.

Figure 1:
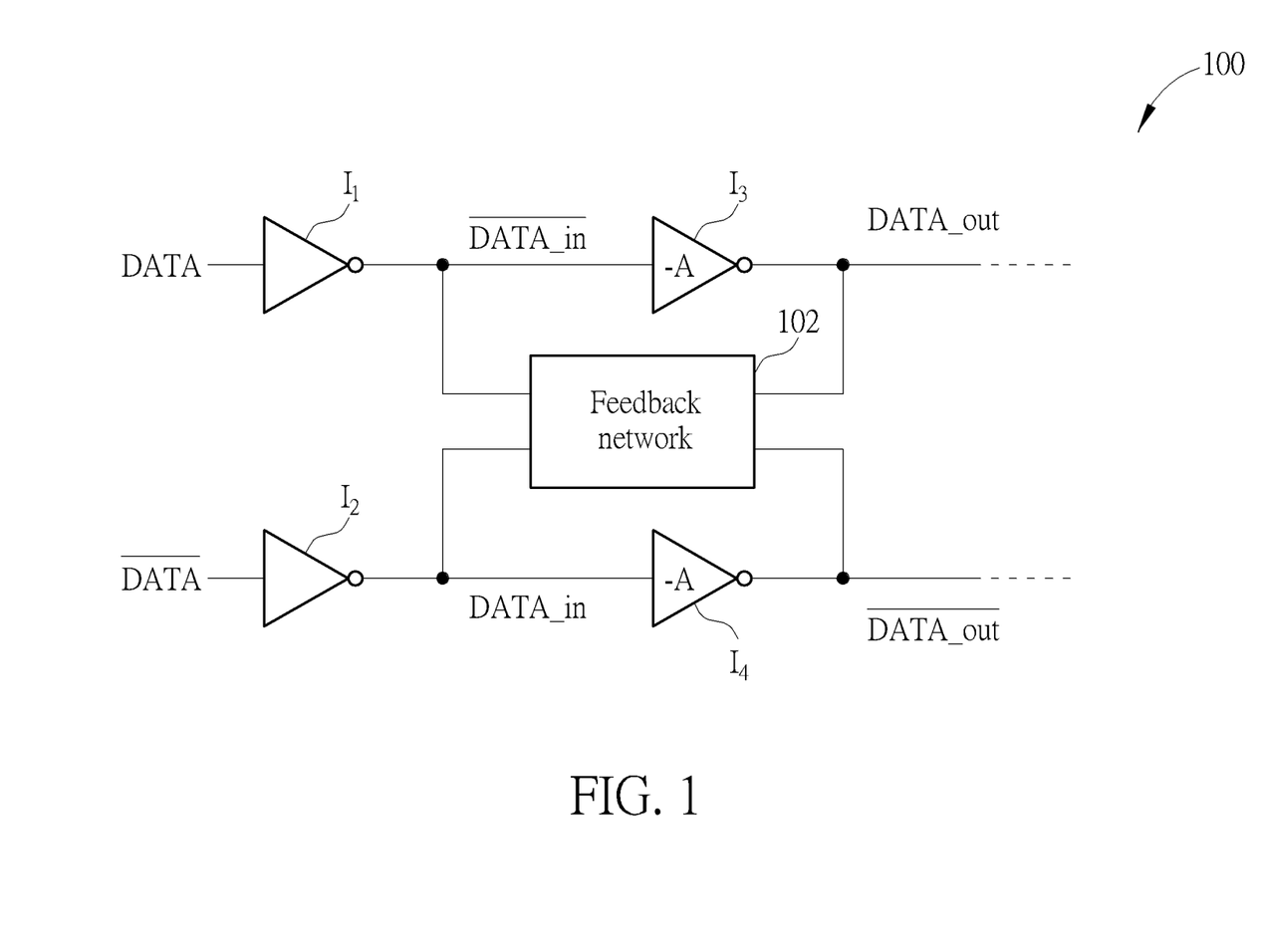
FIG. 1 is a diagram illustrating an output driver with effective slew rate reduction according to an embodiment of the present invention.

FIG. 1 is a diagram illustrating an output driver with effective slew rate reduction according to an embodiment of the present invention. By way of example, but not limitation, the output driver 100 may be a transmission (TX) output driver of a Serializer/Deserializer (SerDes) circuit. As shown in FIG. 1, the output driver 100 includes a plurality of pre-driver circuits $I_1$, $I_2$, a plurality of driver circuits $I_3$, $I_4$, and a feedback network 102. The output driver 100 receives a differential input consisting of data input signals DATA and $\overline{\text{DATA}}$. The pre-driver circuit $I_1$ and the following driver circuit $I_3$ are located at one signal path, and the pre-driver circuit $I_2$ and the following driver circuit $I_4$ are located at another signal path. Specifically, the pre-driver circuit $I_1$ is arranged to receive the data input signal DATA to generate a pre-driving output signal $\overline{\text{DATA\_in}}$, the driver circuit $I_3$ is arranged to receive the pre-driving output signal $\overline{\text{DATA\_in}}$ to generate a data output signal DATA\_out, the pre-driver circuit $I_2$ is arranged to receive the data input signal $\overline{\text{DATA}}$ (which is an inverse version of the data input signal DATA) to generate a pre-driving output signal DATA\_in, and the driver circuit $I_4$ is arranged to receive the pre-driving output signal DATA\_in to generate a data output signal $\overline{\text{DATA\_out}}$ (which is an inverse version of the data output signal DATA\_out). The feedback network 102 is arranged to perform a latching operation upon the pre-driving output signals $\overline{\text{DATA\_in}}$ and DATA\_in according to the data output signals DATA\_out and $\overline{\text{DATA\_out}}$. In this embodiment, the feedback network 102 may further act as a slew rate control circuit when the data input signals DATA and $\overline{\text{DATA}}$ have level transition. For example, the feedback network 102 is capable of providing the output driver 100 with effective slew rate reduction for alleviating the EMI problem, without occupying a large chip area.

Figure 2:
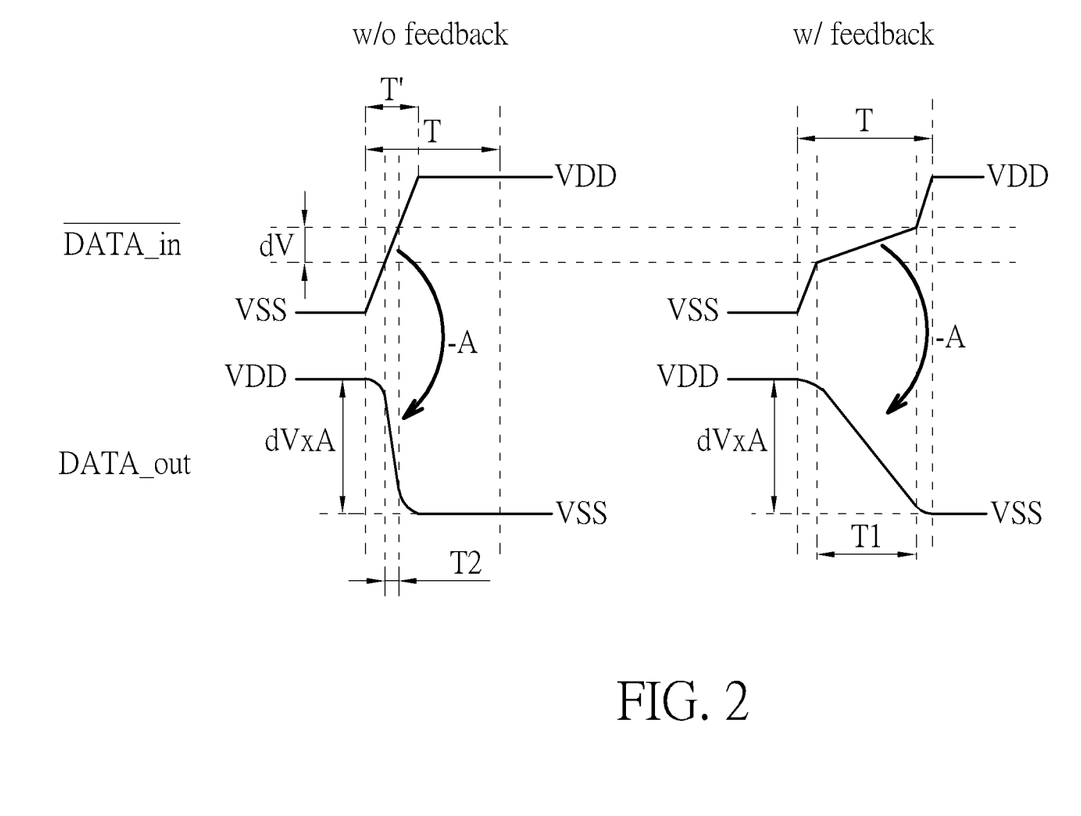
FIG. 2 is a diagram illustrating comparison between a typical output driver without the feedback network and the proposed output driver with the feedback network.

FIG. 2 is a diagram illustrating comparison between a typical output driver without the feedback network 102 and the proposed output driver 100 with the feedback network 102. When the pre-driving output signal $\overline{\text{DATA\_in}}$ is driven by the pre-driver circuit $I_1$ of the typical output driver without the feedback network 102 to have a transition from a logic low level (e.g. VSS) to a logic high level (e.g. VDD), the pre-driving output signal $\overline{\text{DATA\_in}}$ has a voltage increment dV during a time period T2, and the data output signal DATA\_out has a voltage decrement dVxA during the time period T2 due to the negative gain −A of the driver circuit $I_3$. When the pre-driving output signal $\overline{\text{DATA\_in}}$ is driven by the pre-driver circuit $I_1$ of the proposed output driver 100 with the feedback network 102 to have a transition from the logic low level (e.g. VSS) to the logic high level (e.g. VDD), the pre-driving output signal $\overline{\text{DATA\_in}}$ has the voltage increment dV during a time period T1, and the data output signal DATA\_out has the voltage decrement dVxA, during the time period T1 due to the negative gain −A of the driver circuit $I_3$, where T1>T2. For better observation, drawings are exaggerated, such that dVxA associated with the typical output driver looks different from dVxA associated with the proposed output driver 100; however, they are substantially meant to be the same. Compared to the typical output driver without the feedback network 102, the proposed output driver 100 with the feedback network 102 can generate the data output signal DATA\_out with a lower slew rate. Since the slew rate of the data output signal DATA\_out output from the proposed output driver 100 with the feedback network 102 is effectively lower than the slew rate of the data output signal DATA\_out output from the typical output driver without the feedback network 102, the time needed to complete the transition from the logic high level (e.g. VDD) to the logic low level (e.g. VSS) is equal to T which is much longer than T'. As shown in FIG. 2, the feedback network 102 is capable of providing the output driver 100 with effective slew rate reduction for alleviating the EMI problem.

In some embodiments of the present invention, the feedback network 102 may be implemented by inverters such as complementary metal-oxide semiconductor (CMOS) inverters. Since no capacitor array is used, the feedback network 102 does not occupy a large chip area. For better comprehension of technical features of the present invention, several circuit designs of the feedback network 102 are described with reference to the accompanying drawings.

Figure 3:
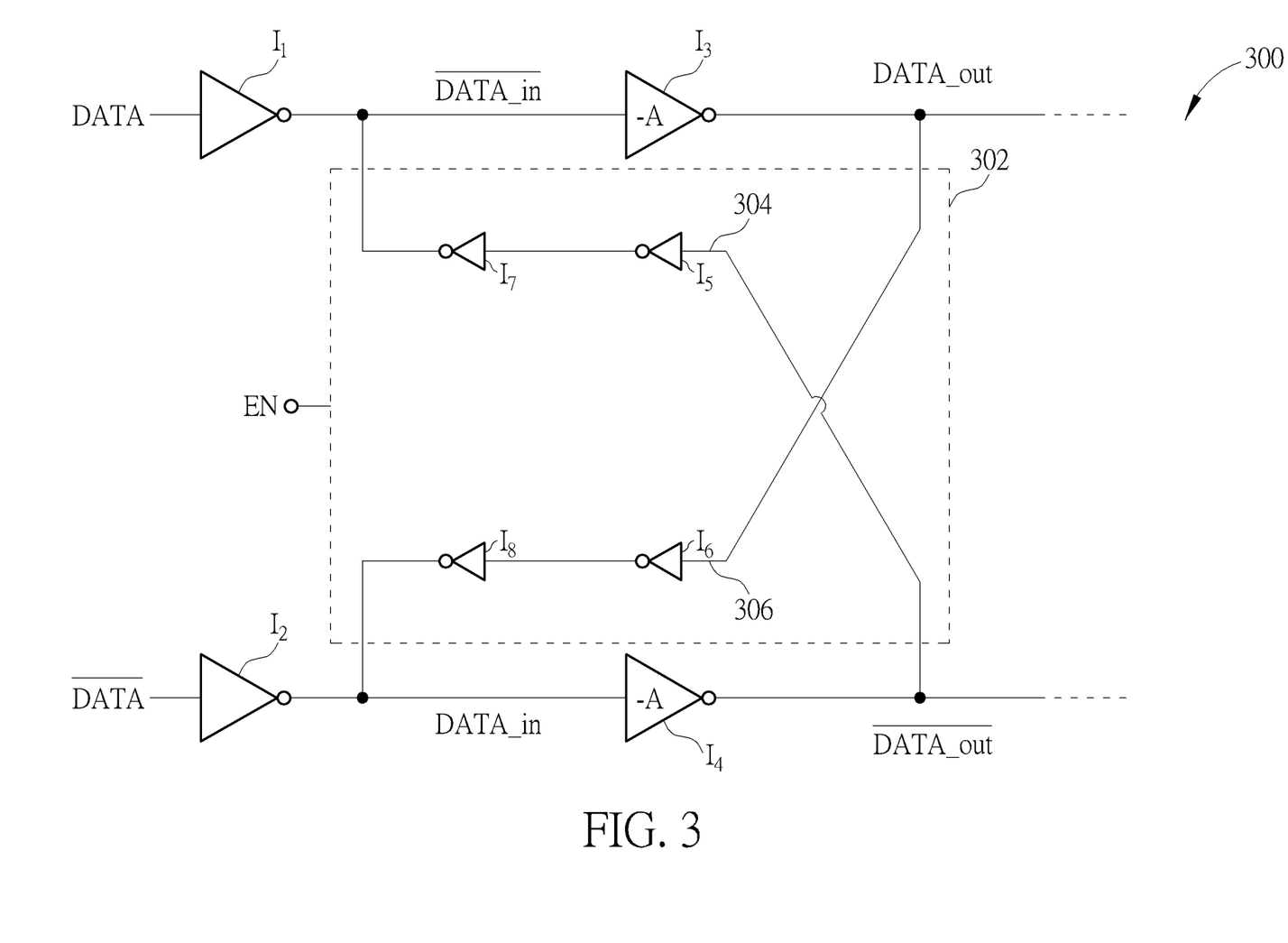
FIG. 3 is a diagram illustrating a first output driver with an inverter-based feedback network according to an embodiment of the present invention.

FIG. 3 is a diagram illustrating a first output driver with an inverter-based feedback network according to an embodiment of the present invention. The output driver 300 is based on the output driver architecture shown in FIG. 1, and has a feedback network 302 implemented by a plurality of inverter circuits $I_5$, $I_6$, $I_7$, and $I_8$. The feedback network 302 has two feedback paths 304 and 306, each having an even number of inverter circuits connected in series. As shown in FIG. 3, the feedback path 304 is coupled between an output port of the driver circuit $I_4$ and an output port of the pre-driver circuit $I_1$, and the feedback path 306 is coupled between an output port of the driver circuit $I_3$ and an output port of the pre-driver circuit $I_2$, where two inverter circuits $I_5$ and $I_7$ are located at the feedback path 304, and two inverter circuits $I_6$ and $I_8$ are located at the feedback path 306. Each inverter circuit is capable of driving its output voltage towards a high logic level (e.g. VDD) when its input voltage has a low logic level (e.g. VSS), and is capable of driving its output voltage to the low logic level (e.g. VSS) when its input voltage has the high logic level (e.g. VDD). In addition, the inverter circuits $I_5$, $I_6$, $I_7$, and $I_8$ are controlled by an enabling signal EN. When the inverter circuits $I_5$, $I_6$, $I_7$, and $I_8$ are enabled by the enabling signal EN (e.g. EN=1), the slew rate reduction function is active. When the inverter circuits $I_5$, $I_6$, $I_7$, and $I_8$ are disabled by the enabling signal EN (EN=0), the slew rate reduction function is inactive.

Consider a case where a binary value represented by the differential input consisting of the data input signals DATA and $\overline{\text{DATA}}$ change from "1" to "0" and from "0" to "1", respectively. The pre-driving output signal $\overline{\text{DATA\_in}}$ is driven by the pre-driver circuit $I_1$ of the output driver 300 to have a transition from a logic low level (e.g. VSS) to a logic high level (e.g. VDD), the data output signal DATA\_out is driven by the driver circuit $I_3$ of the output driver 300 to have a transition from the logic high level (e.g. VDD) to the logic low level (e.g. VSS), the pre-driving output signal DATA\_in is driven by the pre-driver circuit $I_2$ of the output driver 300 to have a transition from the logic high level (e.g. VDD) to the logic low level (e.g. VSS), and the data output signal $\overline{\text{DATA\_out}}$ is driven by the driver circuit $I_4$ of the output driver 300 to have a transition from the logic low level (e.g. VSS) to the logic high level (e.g. VDD).

Due to the inherent propagation delay of the inverter circuits $I_6$ and $I_8$, the output voltage driven by the inverter circuit $I_8$ may not respond to the level transition immediately, and may be higher than the output voltage driven by the pre-driver circuit $I_2$ when the pre-driver circuit $I_2$ is driving the pre-driving output signal DATA_in to have a transition from the logic high level (e.g. VDD) to the logic low level (e.g. VSS). In this way, the feedback path 306 tries to latch the pre-driving output signal DATA_in at a higher voltage when the pre-driver circuit $I_2$ is driving the pre-driving output signal DATA_in to have a transition from the logic high level (e.g. VDD) to the logic low level (e.g. VSS). Hence, the slew rate of the pre-driving output signal DATA_in is reduced by the feedback path 306 during the level transition.

Similarly, due to the inherent propagation delay of the inverter circuits $I_5$ and $I_7$, the output voltage driven by the inverter circuit $I_7$ may not respond to the level transition immediately, and may be lower than the output voltage driven by the pre-driver circuit $I_1$ when the pre-driver circuit $I_1$ is driving the pre-driving output signal $\overline{DATA\_in}$ to have a transition from the logic low level (e.g. VSS) to the logic high level (e.g. VDD). In this way, the feedback path 304 tries to latch the pre-driving output signal $\overline{DATA\_in}$ at a lower voltage when the pre-driver circuit $I_1$ is driving the pre-driving output signal $\overline{DATA\_in}$ to have a transition from the logic low level (e.g. VSS) to the logic high level (e.g. VDD). Hence, the slew rate of the pre-driving output signal $\overline{DATA\_in}$ is reduced by the feedback path 304 during the level transition.

Consider another case where a binary value represented by the differential input consisting of the data input signals DATA and $\overline{DATA}$ change from "0" to "1" and from "1" to "0", respectively. The pre-driving output signal $\overline{DATA\_in}$ is driven by the pre-driver circuit $I_1$ of the output driver 300 to have a transition from a logic high level (e.g. VDD) to a logic low level (e.g. VSS), the data output signal DATA_out is driven by the driver circuit $I_3$ of the output driver 300 to have a transition from the logic low level (e.g. VSS) to the logic high level (e.g. VDD), the pre-driving output signal DATA_in is driven by the pre-driver circuit $I_2$ of the output driver 300 to have a transition from the logic low level (e.g. VSS) to the logic high level (e.g. VDD), and the data output signal $\overline{DATA\_out}$ is driven by the driver circuit $I_4$ of the output driver 300 to have a transition from the logic high level (e.g. VDD) to the logic low level (e.g. VSS).

Due to the inherent propagation delay of the inverter circuits $I_6$ and $I_8$, the output voltage driven by the inverter circuit $I_8$ may not respond to the level transition immediately, and may be lower than the output voltage driven by the pre-driver circuit $I_2$ when the pre-driver circuit $I_2$ is driving the pre-driving output signal DATA_in to have a transition from the logic low level (e.g. VSS) to the logic high level (e.g. VDD). In this way, the feedback path 306 tries to latch the pre-driving output signal DATA_in at a lower voltage when the pre-driver circuit $I_2$ is driving the pre-driving output signal DATA_in to have a transition from the logic low level (e.g. VSS) to the logic high level (e.g. VDD). Hence, the slew rate of the pre-driving output signal DATA_in is reduced by the feedback path 306 during the level transition.

Similarly, due to the inherent propagation delay of the inverter circuits $I_5$ and $I_7$, the output voltage driven by the inverter circuit $I_7$ may not respond to the level transition immediately, and may be higher than the output voltage driven by the pre-driver circuit $I_1$ when the pre-driver circuit $I_1$ is driving the pre-driving output signal $\overline{DATA\_in}$ to have a transition from the logic high level (e.g. VDD) to the logic low level (e.g. VSS). In this way, the feedback path 304 tries to latch the pre-driving output signal $\overline{DATA\_in}$ at a higher voltage when the pre-driver circuit $I_1$ is driving the pre-driving output signal $\overline{DATA\_in}$ to have a transition from the logic high level (e.g. VDD) to the logic low level (e.g. VSS). Hence, the slew rate of the pre-driving output signal $\overline{DATA\_in}$ is reduced by the feedback path 304 during the level transition.

It should be noted that the driving capability of the pre-driver circuit $I_1$ is required to be higher than the driving capability of the feedback path 304, to ensure that the pre-driving output signal $\overline{DATA\_in}$ can have a successful transition between "0" and "1", and the driving capability of the pre-driver circuit $I_2$ is required to be higher than the driving capability of the feedback path 306, to ensure that the pre-driving output signal DATA_in can have a successful transition between "0" and "1".

Figure 4:
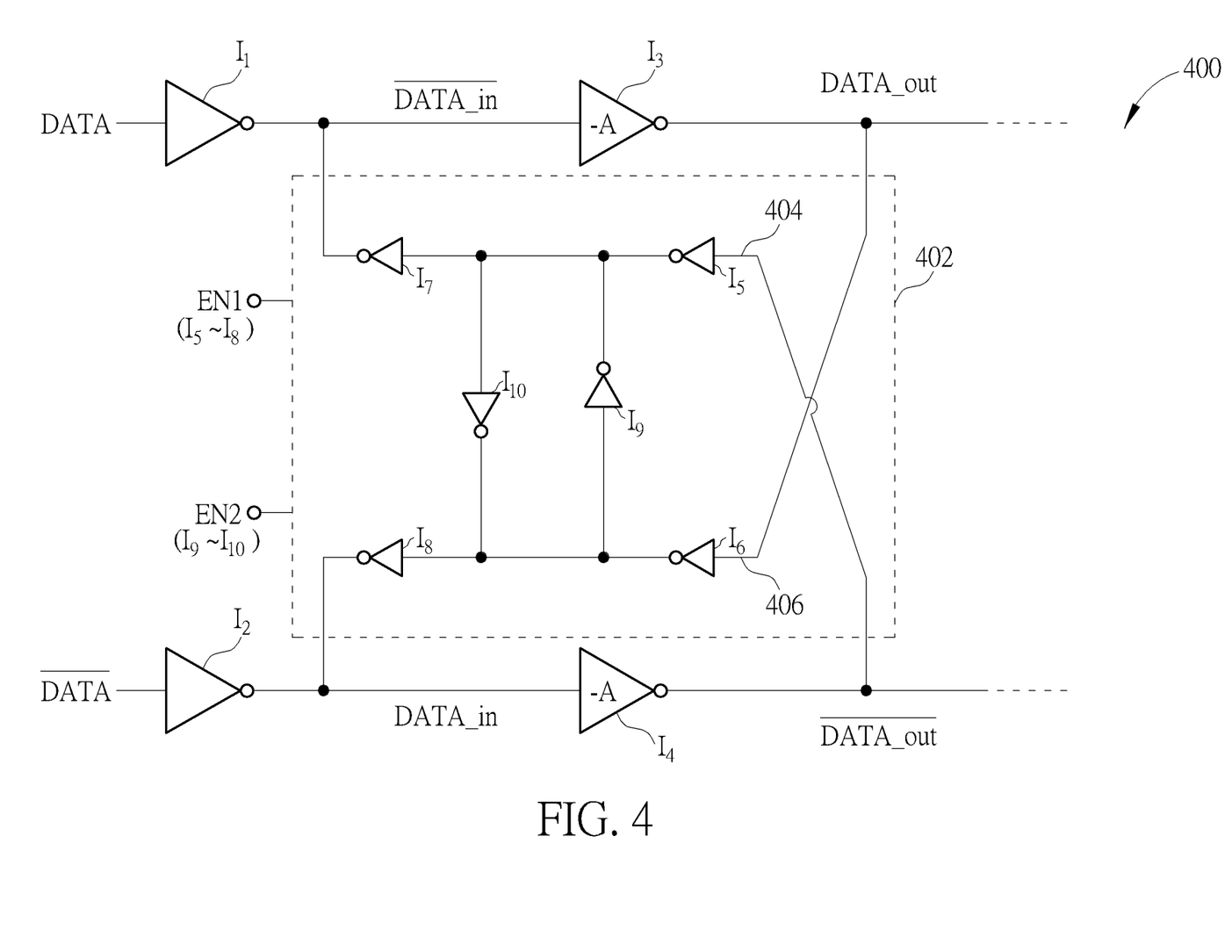
FIG. 4 is a diagram illustrating a second output driver with an inverter-based feedback network according to an embodiment of the present invention.

In some embodiments of the present invention, additional inverter circuits may be added to the feedback network to increase the latency of the feedback network, which in turn leads to more slew rate reduction. FIG. 4 is a diagram illustrating a second output driver with an inverter-based feedback network according to an embodiment of the present invention. The output driver 400 is based on the output driver architecture shown in FIG. 1, and has a feedback network 402 implemented by a plurality of inverter circuits $I_5$, $I_6$, $I_7$, $I_8$, $I_9$, and $I_{10}$. The feedback network 402 has two feedback paths 404 and 406, each having an even number of inverter circuits connected in series. The major difference between the feedback networks 302 and 402 is that the feedback network 402 has extra inverter circuits $I_9$ and $I_{10}$ coupled between the feedback paths 404 and 406. As shown in FIG. 4, the inverter circuit $I_9$ has an input port coupled to an output port of the inverter circuit $I_6$ and an input port of the inverter circuit $I_8$, and has an output port coupled to an output port of the inverter circuit $I_5$ and an input port of the inverter circuit $I_7$; and the inverter circuit $I_{10}$ has an input port coupled to the output port of the inverter circuit $I_5$ and the input port of the inverter circuit $I_7$, and has an output port coupled to the output port of the inverter circuit $I_6$ and the input port of the inverter circuit $I_8$. In addition, the inverter circuits $I_5$, $I_6$, $I_7$, and $I_8$ are controlled by an enabling signal EN1, and the inverter circuits $I_9$ and $I_{10}$ are controlled by an enabling signal EN2. When the inverter circuits $I_5$, $I_6$, $I_7$, and $I_8$ are enabled by the enabling signal EN1 (e.g. EN1=1) and the inverter circuits $I_9$ and $I_{10}$ are disabled by the enabling signal EN2 (e.g. EN2=0), the normal slew rate reduction function is active. When the inverter circuits Is, 16, 17, and Is are enabled by the enabling signal EN1 (e.g. EN1=1) and the inverter circuits $I_9$ and $I_{10}$ are enabled by the enabling signal EN2 (e.g. EN2=1), the enhanced slew rate reduction function is active. When the inverter circuits $I_5$, $I_6$, $I_7$, and $I_8$ are disabled by the enabling signal EN1 (e.g. EN1=0) and the inverter circuits $I_9$ and $I_{10}$ are disabled by the enabling signal EN2 (e.g. EN2=0), no slew rate reduction function is active.

Regarding the embodiment shown in FIG. 4, the extra inverter circuits $I_9$ and $I_{10}$ are located on the output side of the inverter circuits $I_5$ and $I_6$ and located on the input side of inverter circuits $I_7$ and $I_8$. Hence, the insertion of inverter circuits $I_9$ and $I_{10}$ can increase the latency of the feedback network 402 with negligible impact on the signal paths. However, this is for illustrative purposes only, and is not meant to be a limitation of the present invention. Any feedback network design using extra inverter circuits to achieve more slew rate reduction falls within the scope of the present invention. In addition, since the extra inverter circuits $I_9$ and $I_{10}$ are located on the output side of the inverter circuits $I_5$ and $I_6$, an output impedance observed from the output side of the driver circuits $I_3$ and $I_4$ excludes the extra inverter circuits $I_9$ and $I_{10}$. As such, in a case where no slew rate reduction function is active, the slew rate reduction inverter circuits $I_9$ and $I_{10}$ do not create the side effect of increasing the loading to the data output signals DATA_out and $\overline{\text{DATA}}$_out.

Figure 5:
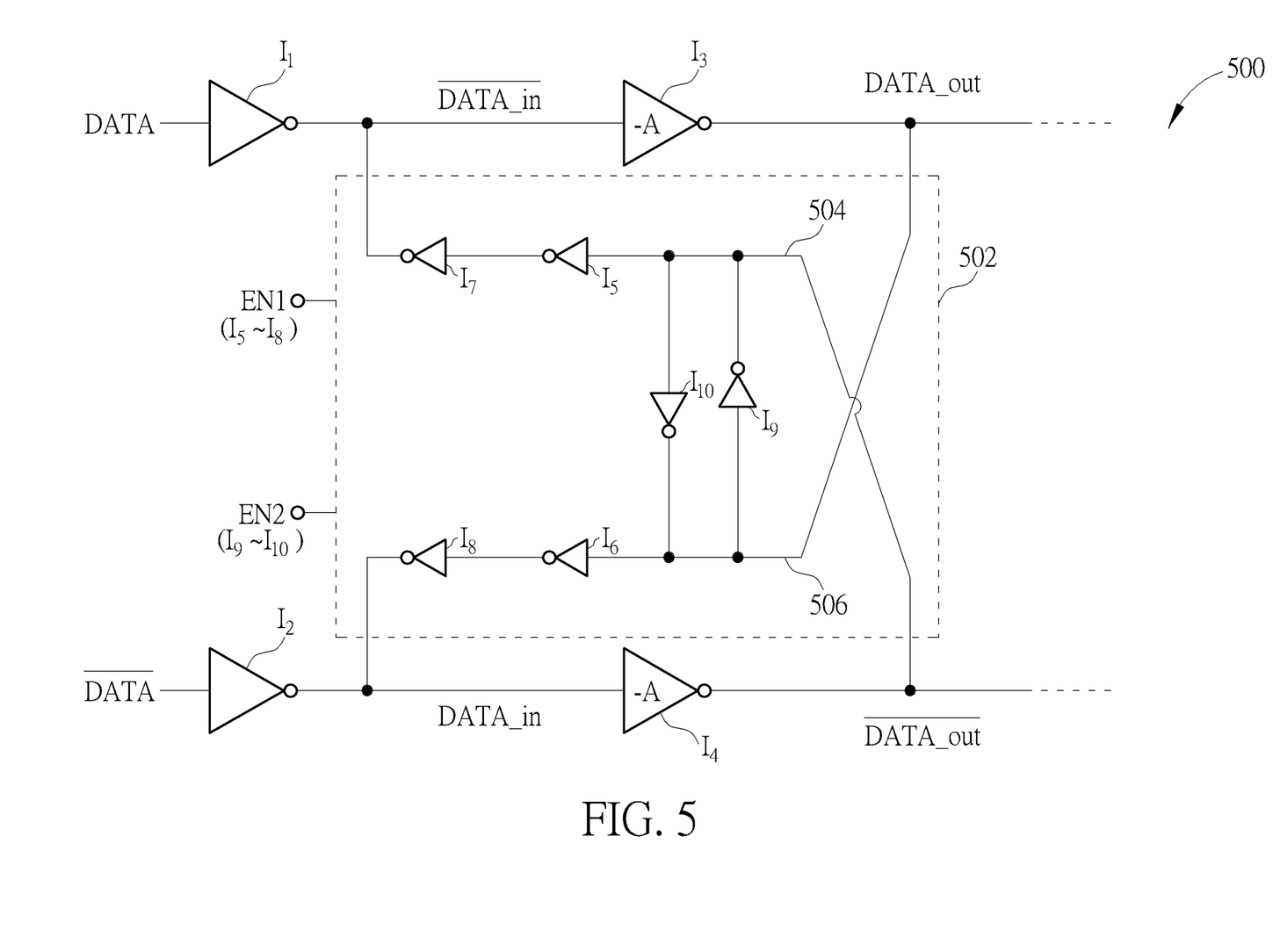
FIG. 5 is a diagram illustrating a third output driver with an inverter-based feedback network according to an embodiment of the present invention.

FIG. 5 is a diagram illustrating a third output driver with an inverter-based feedback network according to an embodiment of the present invention. The output driver 500 is based on the output driver architecture shown in FIG. 1, and has a feedback network 502 implemented by a plurality of inverter circuits $I_5$, $I_6$, $I_7$, $I_8$, $I_9$, and $I_{10}$. The feedback network 502 has two feedback paths 504 and 506, each having an even number of inverter circuits connected in series. The major difference between the feedback networks 402 and 502 is that the feedback network 502 has extra inverter circuits $I_9$ and $I_{10}$ coupled between the feedback paths 504 and 506 and located on the input side of the inverter circuits $I_5$ and $I_6$. Specifically, the inverter circuit $I_9$ has an input port coupled to an input port of the inverter circuit $I_6$, and an output port coupled to an input port of the inverter circuit $I_5$; and the inverter circuit $I_{10}$ has an input port coupled to the input port of the inverter circuit $I_5$, and an output port coupled to the input port of the inverter circuit $I_6$. The same objective of increasing the latency of the feedback network is achieved.

Figure 6:
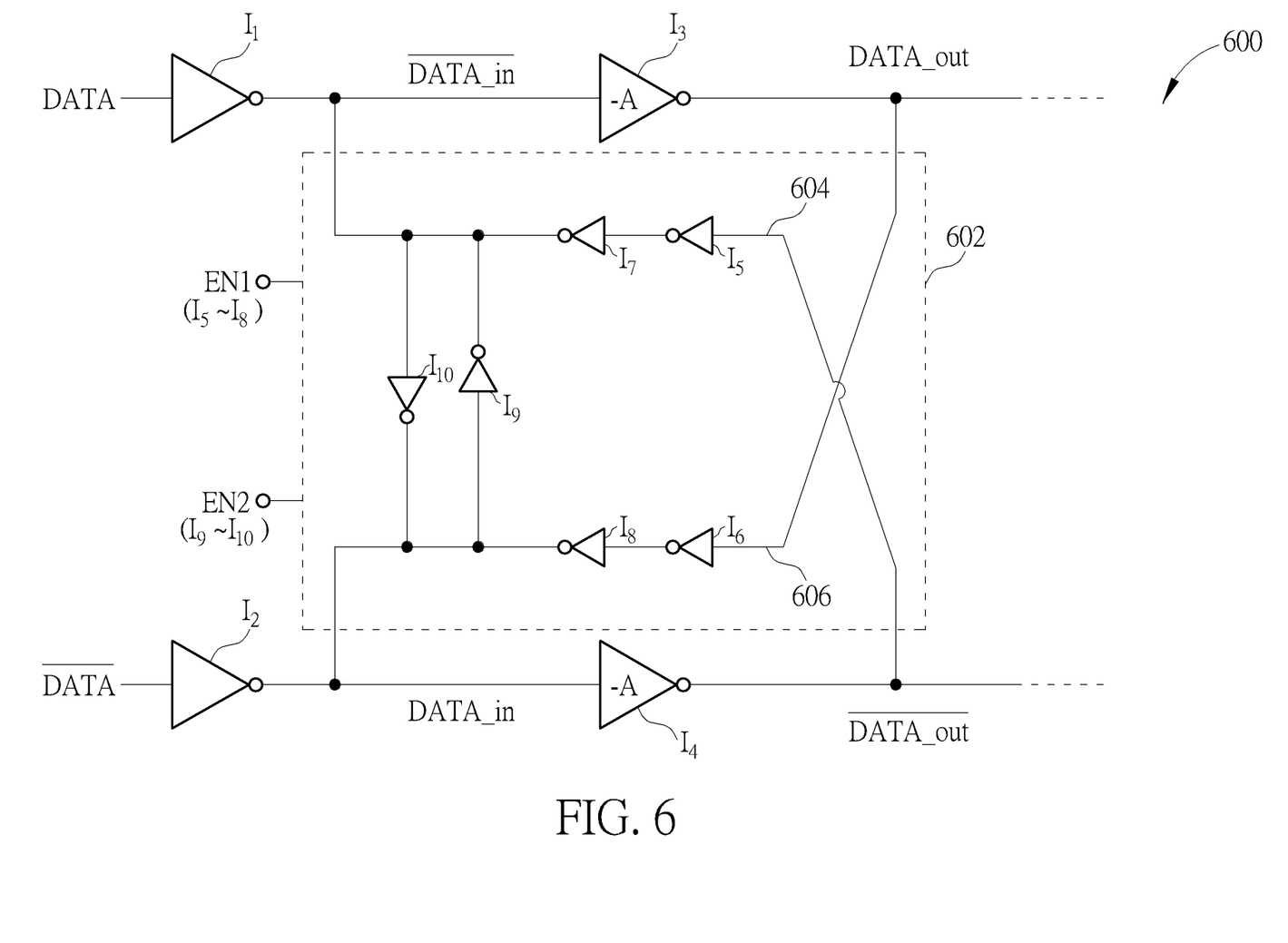
FIG. 6 is a diagram illustrating a fourth output driver with an inverter-based feedback network according to an embodiment of the present invention.

FIG. 6 is a diagram illustrating a fourth output driver with an inverter-based feedback network according to an embodiment of the present invention. The output driver 600 is based on the output driver architecture shown in FIG. 1, and has a feedback network 602 implemented by a plurality of inverter circuits $I_5$, $I_6$, $I_7$, $I_8$, $I_9$, and $I_{10}$. The feedback network 602 has two feedback paths 604 and 606, each having an even number of inverter circuits connected in series. The major difference between the feedback networks 402 and 602 is that the feedback network 602 has extra inverter circuits $I_9$ and $I_{10}$ coupled between the feedback paths 604 and 606 and located on the output side of the inverter circuits $I_7$ and $I_8$. Specifically, the inverter circuit $I_9$ has an input port coupled to an output port of the inverter circuit $I_8$, and an output port coupled to an output port of the inverter circuit $I_7$; and the inverter circuit $I_{10}$ has an input port coupled to the output port of the inverter circuit $I_7$, and an output port coupled to the output port of the inverter circuit $I_8$. The same objective of increasing the latency of the feedback network is achieved.

In above embodiments shown in FIG. 3-FIG. 6, the feedback network 302/402/502/602 performs the latching operation through a cross-coupling configuration. However, this is for illustrative purposes only, and is not meant to be a limitation of the present invention.

Figure 7:
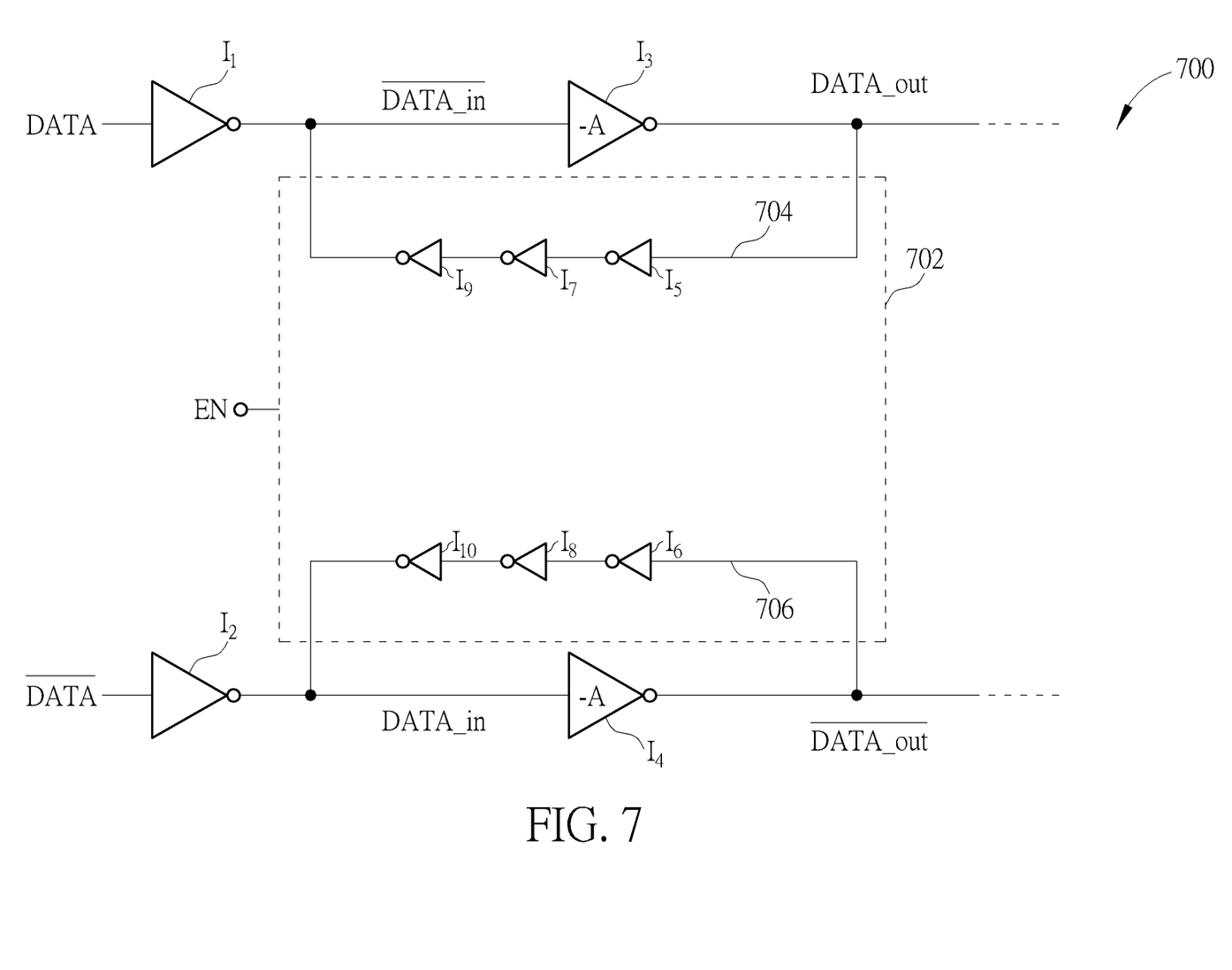
FIG. 7 is a diagram illustrating a fifth output driver with an inverter-based feedback network according to an embodiment of the present invention.

FIG. 7 is a diagram illustrating a fifth output driver with an inverter-based feedback network according to an embodiment of the present invention. The output driver 700 is based on the output driver architecture shown in FIG. 1, and has a feedback network 702 implemented by a plurality of inverter circuits $I_5$, $I_6$, $I_7$, $I_8$, $I_9$, and $I_{10}$. The feedback network 702 has two feedback paths 704 and 706, each having an odd number of inverter circuits connected in series. As shown in FIG. 7, the feedback path 704 is coupled between an output port of the driver circuit $I_3$ and an output port of the pre-driver circuit $I_1$, and the feedback path 706 is coupled between an output port of the driver circuit $I_4$ and an output port of the pre-driver circuit $I_2$, where three inverter circuits $I_5$, $I_7$, and $I_9$ are located at the feedback path 704, and three inverter circuits $I_6$, $I_8$, and $I_{10}$ are located at the feedback path 706. In addition, the inverter circuits $I_5$, $I_6$, $I_7$, $I_8$, $I_9$, and $I_{10}$ are controlled by an enabling signal EN. When the inverter circuits $I_3$, $I_6$, $I_7$, $I_8$, $I_9$, and $I_{10}$ are enabled by the enabling signal EN (e.g. EN=1), the slew rate reduction function is active. When the inverter circuits $I_5$, $I_6$, $I_7$, $I_8$, $I_9$, and $I_{10}$ are disabled by the enabling signal EN (e.g. EN=0), the slew rate reduction function is inactive.

Consider a case where a binary value represented by the differential input consisting of the data input signals DATA and $\overline{\text{DATA}}$ change from "1" to "0" and from "0" to "1", respectively. The pre-driving output signal $\overline{\text{DATA\_in}}$ is driven by the pre-driver circuit $I_1$ of the output driver 700 to have a transition from a logic low level (e.g. VSS) to a logic high level (e.g. VDD), the data output signal DATA_out is driven by the driver circuit $I_3$ of the output driver 700 to have a transition from the logic high level (e.g. VDD) to the logic low level (e.g. VSS), the pre-driving output signal DATA_in is driven by the pre-driver circuit $I_2$ of the output driver 700 to have a transition from the logic high level (e.g. VDD) to the logic low level (e.g. VSS), and the data output signal $\overline{\text{DATA\_out}}$ is driven by the driver circuit $I_4$ of the output driver 700 to have a transition from the logic low level (e.g. VSS) to the logic high level (e.g. VDD).

Due to the inherent propagation delay of the inverter circuits $I_6$, $I_8$, and $I_{10}$, the output voltage driven by the inverter circuit $I_{10}$ may not respond to the level transition immediately, and may be higher than the output voltage driven by the pre-driver circuit $I_2$ when the pre-driver circuit $I_2$ is driving the pre-driving output signal DATA_in to have a transition from the logic high level (e.g. VDD) to the logic low level (e.g. VSS). In this way, the feedback path 706 tries to latch the pre-driving output signal DATA_in at a higher voltage when the pre-driver circuit $I_2$ is driving the pre-driving output signal DATA_in to have a transition from the logic high level (e.g. VDD) to the logic low level (e.g. VSS). Hence, the slew rate of the pre-driving output signal DATA_in is reduced by the feedback path 706 during the level transition.

Similarly, due to the inherent propagation delay of the inverter circuits $I_5$, $I_7$, and $I_9$, the output voltage driven by the inverter circuit $I_9$ may not respond to the level transition immediately, and may be lower than the output voltage driven by the pre-driver circuit $I_1$ when the pre-driver circuit $I_1$ is driving the pre-driving output signal $\overline{\text{DATA\_in}}$ to have a transition from the logic low level (e.g. VSS) to the logic high level (e.g. VDD). In this way, the feedback path 704 tries to latch the pre-driving output signal $\overline{\text{DATA\_in}}$ at a lower voltage when the pre-driver circuit $I_1$ is driving the pre-driving output signal $\overline{\text{DATA\_in}}$ to have a transition from the logic low level (e.g. VSS) to the logic high level (e.g. VDD). Hence, the slew rate of the pre-driving output signal $\overline{\text{DATA\_in}}$ is reduced by the feedback path 704 during the level transition.

Consider another case where a binary value represented by the differential input consisting of the data input signals DATA and $\overline{\text{DATA}}$ change from "0" to "1" and from "1" to "0", respectively. The pre-driving output signal $\overline{\text{DATA\_in}}$ is driven by the pre-driver circuit $I_1$ of the output driver 700 to have a transition from a logic high level (e.g. VDD) to a logic low level (e.g. VSS), the data output signal DATA_out is driven by the driver circuit $I_3$ of the output driver 700 to have a transition from the logic low level (e.g. VSS) to the logic high level (e.g. VDD), the pre-driving output signal DATA_in is driven by the pre-driver circuit $I_2$ of the output driver 700 to have a transition from the logic low level (e.g. VSS) to the logic high level (e.g. VDD), and the data output signal $\overline{DATA\_out}$ is driven by the driver circuit $I_4$ of the output driver 700 to have a transition from the logic high level (e.g. VDD) to the logic low level (e.g. VSS).

Due to the inherent propagation delay of the inverter circuits $I_6$, $I_8$, and $I_{10}$, the output voltage driven by the inverter circuit $I_{10}$ may not respond to the level transition immediately, and may be lower than the output voltage driven by the pre-driver circuit $I_2$ when the pre-driver circuit $I_2$ is driving the pre-driving output signal DATA_in to have a transition from the logic low level (e.g. VSS) to the logic high level (e.g. VDD). In this way, the feedback path 706 tries to latch the pre-driving output signal DATA_in at a lower voltage when the pre-driver circuit $I_2$ is driving the pre-driving output signal DATA_in to have a transition from the logic low level (e.g. VSS) to the logic high level (e.g. VDD). Hence, the slew rate of the pre-driving output signal DATA_in is reduced by the feedback path 706 during the level transition.

Similarly, due to the inherent propagation delay of the inverter circuits $I_5$, $I_7$, and $I_9$ the output voltage driven by the inverter circuit $I_9$ may not respond to the level transition immediately, and may be higher than the output voltage driven by the pre-driver circuit $I_1$ when the pre-driver circuit $I_1$ is driving the pre-driving output signal $\overline{DATA\_in}$ to have a transition from the logic high level (e.g. VDD) to the logic low level (e.g. VSS). In this way, the feedback path 704 tries to latch the pre-driving output signal $\overline{DATA\_in}$ at a higher voltage when the pre-driver circuit $I_1$ is driving the pre-driving output signal $\overline{DATA\_in}$ to have a transition from the logic high level (e.g. VDD) to the logic low level (e.g. VSS). Hence, the slew rate of the pre-driving output signal $\overline{DATA\_in}$ is reduced by the feedback path 704 during the level transition.

It should be noted that the driving capability of the pre-driver circuit $I_1$ is required to be higher than the driving capability of the feedback path 704, to ensure that the pre-driving output signal $\overline{DATA\_in}$ can have a successful transition between "0" and "1", and the driving capability of the pre-driver circuit $I_2$ is required to be higher than the driving capability of the feedback path 706, to ensure that the pre-driving output signal DATA_in can have a successful transition between "0" and "1".

Figure 8:
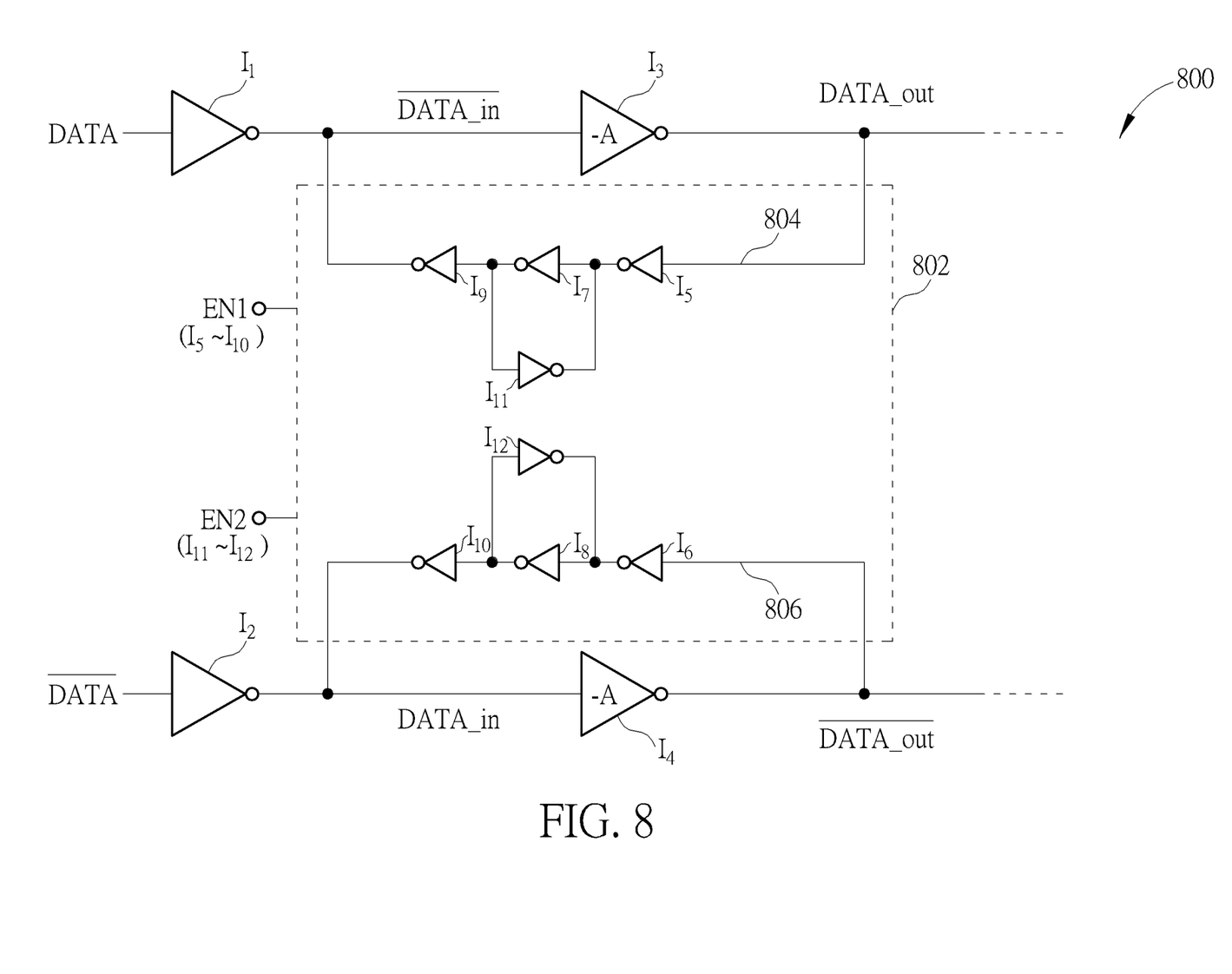
FIG. 8 is a diagram illustrating a sixth output driver with an inverter-based feedback network according to an embodiment of the present invention.

In some embodiments of the present invention, additional inverter circuits may be added to the feedback network to increase the latency of the feedback network, which in turn leads to more slew rate reduction. FIG. 8 is a diagram illustrating a sixth output driver with an inverter-based feedback network according to an embodiment of the present invention. The output driver 800 is based on the output driver architecture shown in FIG. 1, and has a feedback network 802 implemented by a plurality of inverter circuits $I_5$, $I_6$, $I_7$, $I_8$, $I_9$, $I_{10}$, $I_{11}$, and $I_{12}$. The feedback network 802 has two feedback paths 804 and 806, each having an odd number of inverter circuits connected in series. The major difference between the feedback networks 802 and 702 is that the feedback network 802 has one extra inverter circuit $I_{11}$ coupled to the feedback path 804 and one extra inverter circuit $I_{12}$ coupled to the feedback path 806. As shown in FIG. 8, the inverter circuit $I_{11}$ has an input port coupled to an output port of the inverter circuit $I_7$, and an output port coupled to an input port of the inverter circuit $I_7$; and the inverter circuit $I_{12}$ has an input port coupled to the output port of the inverter circuit $I_8$, and an output port coupled to the input port of the inverter circuit $I_8$. In addition, the inverter circuits $I_5$, $I_6$, $I_7$, $I_8$, $I_9$, and $I_{10}$ are controlled by an enabling signal EN1, and the inverter circuits and $I_{12}$ are controlled by an enabling signal EN2. When the inverter circuits $I_5$, $I_6$, $I_7$, $I_8$, $I_9$, and $I_{10}$ are enabled by the enabling signal EN1 (e.g. EN1=1) and the inverter circuits $I_{11}$ and $I_{12}$ are disabled by the enabling signal EN2 (e.g. EN2=0), the normal slew rate reduction function is active. When the inverter circuits $I_5$, $I_6$, $I_7$, $I_8$, $I_9$, and $I_{10}$ are enabled by the enabling signal EN1 (e.g. EN1=1) and the inverter circuits $I_{11}$ and $I_{12}$ are enabled by the enabling signal EN2 (e.g. EN2=1), the enhanced slew rate reduction function is active. When the inverter circuits $I_5$, $I_6$, $I_7$, $I_8$, $I_9$, and $I_{10}$ are disabled by the enabling signal EN1 (e.g. EN1=0) and the inverter circuits $I_{11}$ and $I_{12}$ are disabled by the enabling signal EN2 (e.g. EN2=0), no slew rate reduction function is active.

Regarding the embodiment shown in FIG. 8, the extra inverter circuit $I_{11}$ is connected between two ends of the inverter circuit $I_7$, and the extra inverter circuit $I_{12}$ is connected between two ends of the inverter circuit $I_8$. Hence, the insertion of inverter circuits $I_{11}$ and $I_{12}$ can increase the latency of the feedback network 802 with negligible impact on the signal paths. However, this is for illustrative purposes only, and is not meant to be a limitation of the present invention. Any feedback network design using extra inverter circuits to achieve more slew rate reduction falls within the scope of the present invention.

Figure 9:
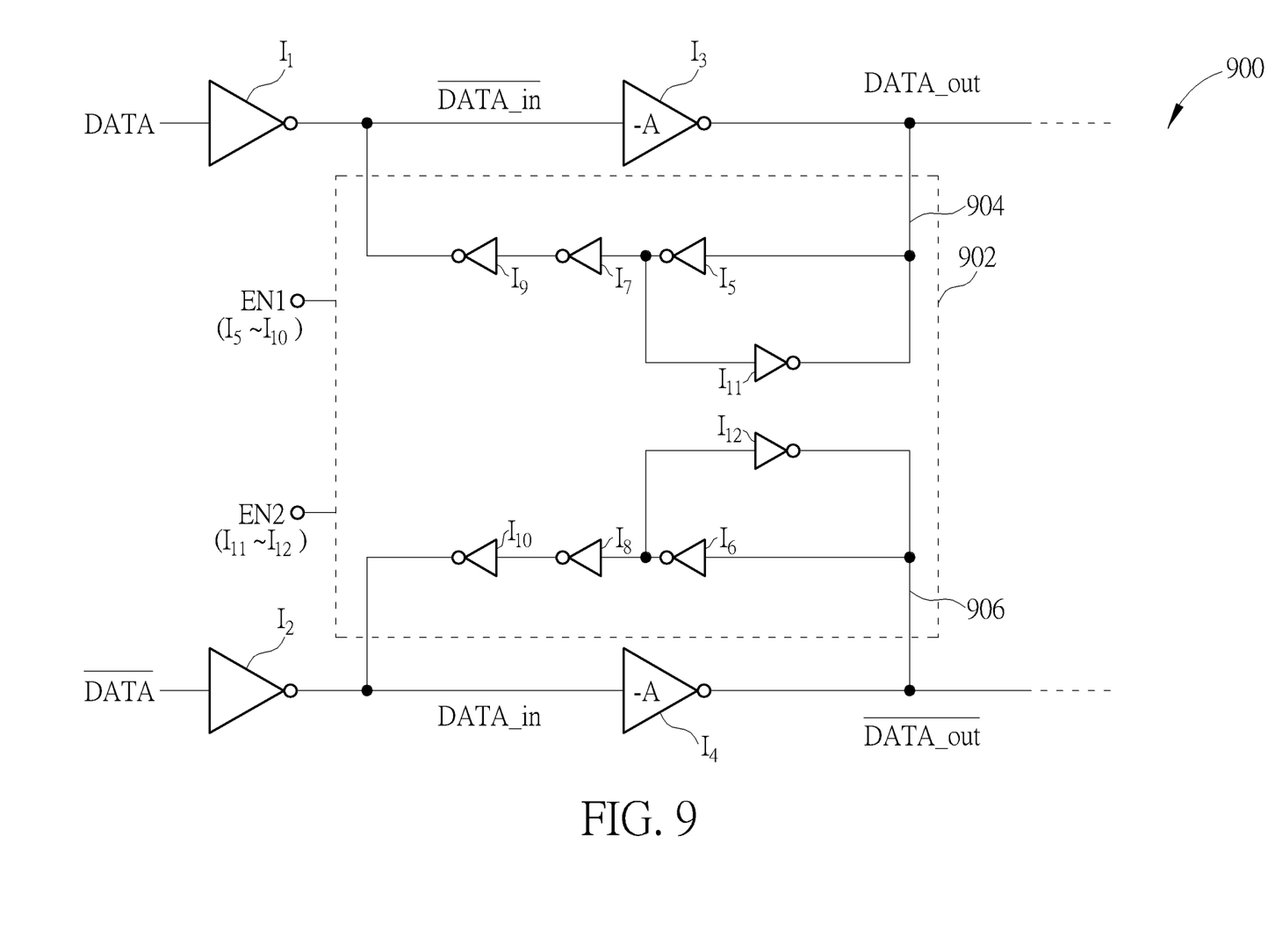
FIG. 9 is a diagram illustrating a seventh output driver with an inverter-based feedback network according to an embodiment of the present invention.

FIG. 9 is a diagram illustrating a seventh output driver with an inverter-based feedback network according to an embodiment of the present invention. The output driver 900 is based on the output driver architecture shown in FIG. 1, and has a feedback network 902 implemented by a plurality of inverter circuits $I_5$, $I_6$, $I_7$, $I_8$, $I_9$, $I_{10}$, $I_{11}$, and $I_{12}$. The feedback network 902 has two feedback paths 904 and 906, each having an odd number of inverter circuits connected in series. The major difference between the feedback networks 802 and 902 is that the feedback network 902 has the extra inverter circuit $I_{11}$ connected between two ends of the inverter circuit $I_5$ and the extra inverter circuit $I_{12}$ connected between two ends of the inverter circuit $I_6$. Specifically, the inverter circuit $I_{11}$ has an input port coupled to an output port of the inverter circuit $I_5$, and an output port coupled to an input port of the inverter circuit $I_5$; and the inverter circuit $I_{12}$ has an input port coupled to the output port of the inverter circuit $I_6$, and an output port coupled to the input port of the inverter circuit $I_6$. The same objective of increasing the latency of the feedback network is achieved.

Figure 10:
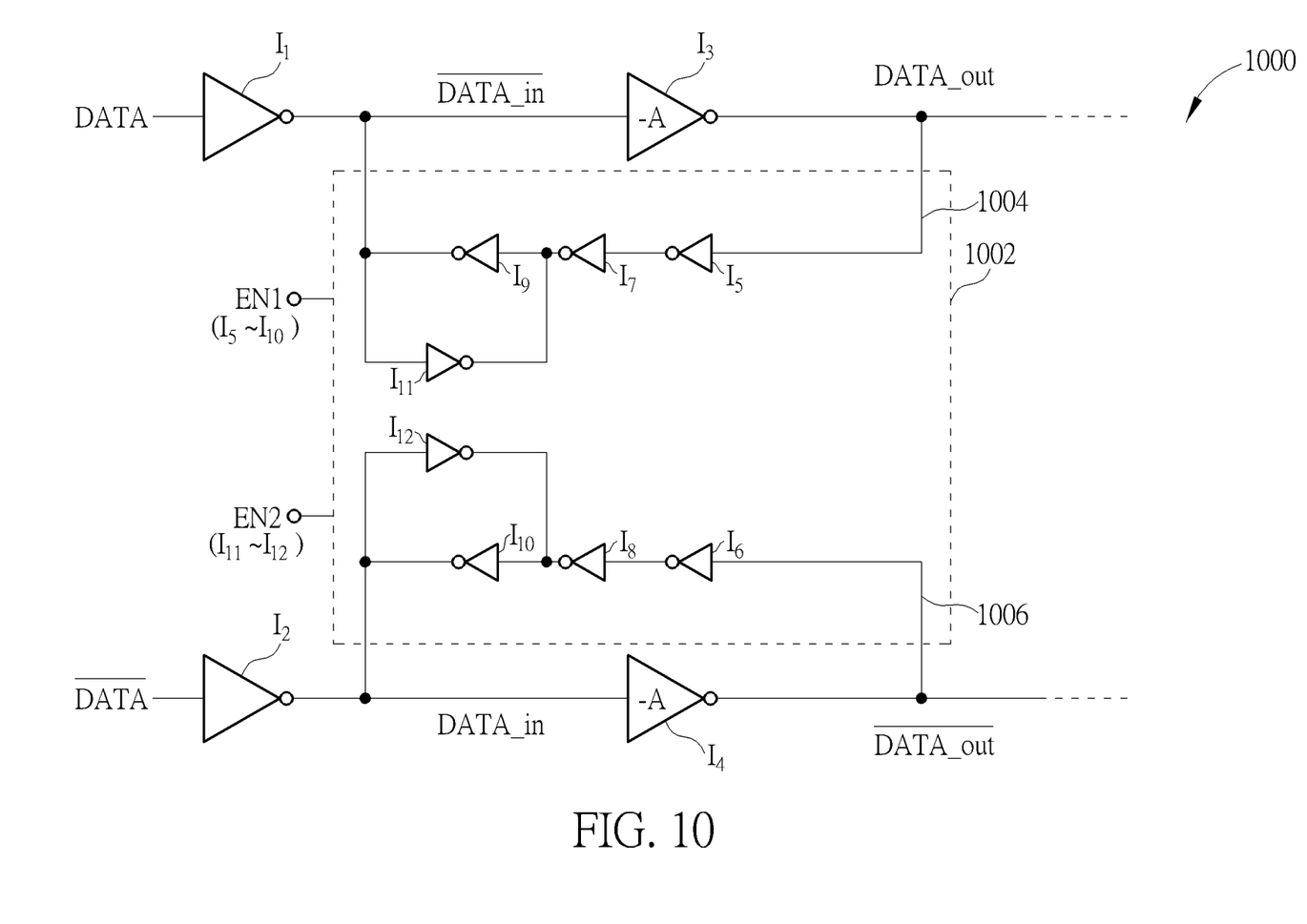
FIG. 10 is a diagram illustrating an eighth output driver with an inverter-based feedback network according to an embodiment of the present invention.

FIG. 10 is a diagram illustrating an eighth output driver with an inverter-based feedback network according to an embodiment of the present invention. The output driver 1000 is based on the output driver architecture shown in FIG. 1, and has a feedback network 1002 implemented by a plurality of inverter circuits $I_5$, $I_6$, $I_7$, $I_8$, $I_9$, $I_{10}$, $I_{11}$, and $I_{12}$. The feedback network 1002 has two feedback paths 1004 and 1006, each having an odd number of inverter circuits connected in series. The major difference between the feedback networks 802 and 1002 is that the feedback network 1002 has the extra inverter circuit $I_{11}$ connected between two ends of the inverter circuit $I_9$ and the extra inverter circuit $I_{12}$ connected between two ends of the inverter circuit $I_{10}$. Specifically, the inverter circuit has an input port coupled to an output port of the inverter circuit $I_9$, and an output port coupled to an input port of the inverter circuit $I_9$; and the inverter circuit $I_{12}$ has an input port coupled to the output port of the inverter circuit $I_{10}$, and an output port coupled to the input port of the inverter circuit $I_{10}$. The same objective of increasing the latency of the feedback network is achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output driver comprising:
a first pre-driver circuit, arranged to receive a first data input signal to generate a first pre-driving output signal;
a first driver circuit, arranged to receive the first pre-driving output signal to generate a first data output signal;
a second pre-driver circuit, arranged to receive a second data input signal to generate a second pre-driving output signal, wherein the first data input signal and the second data input signal are a differential input of the output driver;
a second driver circuit, arranged to receive the second pre-driving output signal to generate a second data output signal; and
a feedback network, arranged to perform a latching operation upon the first pre-driving output signal and the second pre-driving output signal according to the first data output signal and the second data output signal, wherein the feedback network comprises:
a first feedback path, coupled between an output port of the first driver circuit and an output port of the second pre-driver circuit; and
a second feedback path, coupled between an output port of the second driver circuit and an output port of the first pre-driver circuit, wherein each of the first feedback path and the second feedback path comprises an even number of inverter circuits connected in series.

2. The output driver of claim 1, wherein the first feedback path comprises a first inverter circuit, the second feedback path comprises a second inverter circuit, and the feedback network further comprises:
a third inverter circuit, having an input port coupled to an output port of the second inverter circuit, and an output port coupled to an output port of the first inverter circuit; and
a fourth inverter circuit, having an input port coupled to the output port of the first inverter circuit, and an output port coupled to the output port of the second inverter circuit.

3. The output driver of claim 1, wherein the first feedback path comprises a first inverter circuit, the second feedback path comprises a second inverter circuit, and the feedback network further comprises:
a third inverter circuit, having an input port coupled to an input port of the second inverter circuit, and an output port coupled to an input port of the first inverter circuit; and
a fourth inverter circuit, having an input port coupled to the input port of the first inverter circuit, and an output port coupled to the input port of the second inverter circuit.

4. The output driver of claim 1, wherein the output driver is a part of a Serializer/Deserializer (SerDes) circuit.

5. An output driver comprising:
a first pre-driver circuit, arranged to receive a first data input signal to generate a first pre-driving output signal;
a first driver circuit, arranged to receive the first pre-driving output signal to generate a first data output signal;
a second pre-driver circuit, arranged to receive a second data input signal to generate a second pre-driving output signal, wherein the first data input signal and the second data input signal are a differential input of the output driver;
a second driver circuit, arranged to receive the second pre-driving output signal to generate a second data output signal; and
a feedback network, arranged to perform a latching operation upon the first pre-driving output signal and the second pre-driving output signal according to the first data output signal and the second data output signal, wherein the feedback network comprises:
a first feedback path, coupled between an output port of the first driver circuit and an output port of the first pre-driver circuit; and
a second feedback path, coupled between an output port of the second driver circuit and an output port of the second pre-driver circuit.

6. The output driver of claim 5, wherein each of the first feedback path and the second feedback path comprises an odd number of inverter circuits connected in series.

7. The output driver of claim 6, wherein the first feedback path comprises a first inverter circuit, the second feedback path comprises a second inverter circuit, and the feedback network further comprises:
a third inverter circuit, having an input port coupled to an output port of the first inverter circuit, and an output port coupled to an input port of the first inverter circuit; and
a fourth inverter circuit, having an input port coupled to an output port of the second inverter circuit, and an output port coupled to an input port of the second inverter circuit.

8. An output driving method comprising:
receiving a first data input signal to generate a first pre-driving output signal;
receiving the first pre-driving output signal to generate a first data output signal;
receiving a second data input signal to generate a second pre-driving output signal, wherein the first data input signal and the second data input signal are a differential input;
receiving the second pre-driving output signal to generate a second data output signal; and
performing a latching operation upon the first pre-driving output signal and the second pre-driving output signal according to the first data output signal and the second data output signal, comprising:
performing the latching operation upon the first pre-driving output signal according to the second data output signal, comprising:
performing the latching operation upon the first pre-driving output signal by passing the second data output signal through a first feedback path with an even number of inverter circuits connected in series; and
performing the latching operation upon the second pre-driving output signal according to the first data output signal, comprising:
performing the latching operation upon the second pre-driving output signal by passing the first data output signal through a second feedback path with an even number of inverter circuits connected in series.

9. The output driving method of claim 8, wherein the first feedback path comprises a first inverter circuit, the second feedback path comprises a second inverter circuit, and performing the latching operation upon the first pre-driving output signal and the second pre-driving output signal according to the first data output signal and the second data output signal further comprises:
  coupling an input port of a third inverter circuit to an output port of the second inverter circuit, and coupling an output port of the third inverter circuit to an output port of the first inverter circuit; and
  coupling an input port of a fourth inverter circuit to the output port of the first inverter circuit, and coupling an output port of the fourth inverter to the output port of the second inverter circuit.

10. The output driving method of claim 8, wherein the first feedback path comprises a first inverter circuit, the second feedback path comprises a second inverter circuit, and performing the latching operation upon the first pre-driving output signal and the second pre-driving output signal according to the first data output signal and the second data output signal further comprises:
  coupling an input port of a third inverter circuit to an input port of the second inverter circuit, and coupling an output port of the third inverter circuit to an input port of the first inverter circuit; and
  coupling an input port of a fourth inverter circuit to the input port of the first inverter circuit, and coupling an output port of the fourth inverter circuit to the input port of the second inverter circuit.

11. An output driving method comprising:
  receiving a first data input signal to generate a first pre-driving output signal;
  receiving the first pre-driving output signal to generate a first data output signal;
  receiving a second data input signal to generate a second pre-driving output signal, wherein the first data input signal and the second data input signal are a differential input;
  receiving the second pre-driving output signal to generate a second data output signal; and
  performing a latching operation upon the first pre-driving output signal and the second pre-driving output signal according to the first data output signal and the second data output signal, comprising:
    performing the latching operation upon the first pre-driving output signal according to the first data output signal; and
    performing the latching operation upon the second pre-driving output signal according to the second data output signal.

12. The output driving method of claim 11, wherein performing the latching operation upon the first pre-driving output signal according to the first data output signal comprises:
  performing the latching operation upon the first pre-driving output signal by passing the first data output signal through a first feedback path with an odd number of inverter circuits connected in series; and
  performing the latching operation upon the second pre-driving output signal according to the second data output signal comprises:
  performing the latching operation upon the second pre-driving output signal by passing the second data output signal through a second feedback path with an odd number of inverter circuits connected in series.

13. The output driving method of claim 12, wherein the first feedback path comprises a first inverter circuit, the second feedback path comprises a second inverter circuit, and performing the latching operation upon the first pre-driving output signal and the second pre-driving output signal according to the first data output signal and the second data output signal further comprises:
  coupling an input port of a third inverter circuit to an output port of the first inverter circuit, and coupling an output port of the third inverter circuit to an input port of the first inverter circuit; and
  coupling an input port of a fourth inverter circuit to an output port of the second inverter circuit, and coupling an output port of the fourth inverter circuit to an input port of the second inverter circuit.

14. The output driving method of claim 8, wherein the output driving method is employed by a Serializer/Deserializer (SerDes) circuit.

* * * * *